(12) United States Patent
Doty

(10) Patent No.: US 7,498,812 B2
(45) Date of Patent: Mar. 3, 2009

(54) NMR MAS PROBE WITH CRYOGENICALLY COOLED CRITICAL CIRCUIT COMPONENTS

(75) Inventor: F. David Doty, Columbia, SC (US)

(73) Assignee: Doty Scientific, Inc., Columbia, SC (US)

(*) Notice: Subject to any disclaimer, the term of this patent is extended or adjusted under 35 U.S.C. 154(b) by 184 days.

(21) Appl. No.: 11/613,186

(22) Filed: Dec. 19, 2006

(65) Prior Publication Data

US 2008/0136413 A1    Jun. 12, 2008

Related U.S. Application Data

(62) Division of application No. 10/906,379, filed on Feb. 17, 2005, now Pat. No. 7,151,374.

(60) Provisional application No. 60/593,422, filed on Jan. 12, 2005.

(51) Int. Cl.
- *G01V 3/00* (2006.01)
- *H01G 7/00* (2006.01)
- *F25B 19/00* (2006.01)
- *F25D 15/00* (2006.01)

(52) U.S. Cl. .................. 324/318; 29/25.41; 62/51.1; 62/331

(58) Field of Classification Search ......... 324/300–322; 29/25.41–25.42, 592–603.27, 606–609; 335/300; 333/229, 234; 62/45.1–54.3, 267–270, 330–335, 62/337–339, 440–466

See application file for complete search history.

(56) References Cited

U.S. PATENT DOCUMENTS

| | | | |
|---|---|---|---|
| 4,940,942 | A | 7/1990 | Bartuska et al. |
| 5,424,645 | A | 6/1995 | Doty |
| 5,508,613 | A | 4/1996 | Kotsubo et al. |
| 5,585,723 | A | 12/1996 | Withers |
| 5,872,452 | A | 2/1999 | Cory et al. |
| 6,130,537 | A | 10/2000 | Doty et al. |
| 6,320,384 | B1 | 11/2001 | Doty et al. |
| 6,677,751 | B1 | 1/2004 | Marek et al. |
| 6,686,741 | B2 | 2/2004 | Hasegawa |
| 7,151,374 | B2 * | 12/2006 | Doty ............ 324/321 |
| 7,282,919 | B2 * | 10/2007 | Doty et al. ......... 324/321 |

(Continued)

OTHER PUBLICATIONS

Barbara et al., Target Field Design for Magic Angle Gradient Coils, Journal of Magnetic Resonance, 1999, pp. 582-288, vol. 140.

(Continued)

*Primary Examiner*—Dixomara Vargas
(74) *Attorney, Agent, or Firm*—Oppedahl Patent Law Firm LLC

(57) ABSTRACT

An NMR probe contains a metallic dewar for use in a high field magnet, the dewar characterized as having a major fraction of its inner wall made from an alloy whose weight composition includes at least 70% copper, less than 20% zinc, less than 10% nickel, less than 8% Cr, less than 4% Pb, less than 0.15% iron, less than 0.15% cobalt, and at least 3% from the set comprised of tin, silicon, aluminum, and chromium, and said inner wall further characterized as being plated with a pure metal on at least one surface.

2 Claims, 3 Drawing Sheets

U.S. PATENT DOCUMENTS

2006/0176056 A1 * 8/2006 Doty et al. .................. 324/321

OTHER PUBLICATIONS

Doty, Probe Design & Construction, 1995, pp. 3753-3762.
Doty et al., Magnetism in High-Resolution NMR Probe Design. II: HR MAS, Concepts in Magnetic Resonance, 1998, pp. 239-260, vol. 10, No. 4.
Doty et al., Reducing Decoupler Heating of Lossy Samples in Triple-Resonance MAS probes at 750 MHz, 45th ENC-Asilomer, 2004.
Martin et al., Design of a triple resonance magic angle sample spinning probe for high field solid state nuclear magnetic resonance, Review of Scientific Instruments, 2003 pp. 314-323, vol. 74, No. 6.
Paulson et al., Cross polarization, radio frequency field homogeneity, and circuit balancing in high field solid state NMR probes, Journal of Magnetic Resonance, 2004, pp. 314-323, vol. 171.

* cited by examiner

NMR MAS PROBE WITH CRYOGENICALLY COOLED CRITICAL CIRCUIT COMPONENTS

CROSS-REFERENCE TO RELATED APPLICATIONS

This application is a divisional of U.S. application Ser. No. 10/906,379, filed Feb. 17, 2005 now U.S. Pat. No. 7,151,374, which application claims priority from U.S. application No. 60/593,422, filed Jan. 12, 2005, both of which applications are incorporated herein by reference for all purposes.

FIELD OF THE INVENTION

The field of this invention is a probe for Nuclear Magnetic Resonance (NMR) Magic Angle Spinning (MAS) with cryogenically cooled critical circuit components while the sample is near room temperature within narrow-bore high-field magnets.

BACKGROUND OF THE INVENTION

Because of the richness of the information available from NMR, it has often been argued that NMR is the most powerful analytical technique for molecular structure determination. However, NMR has been more successful with liquids or materials dissolved in solvents than with rigid solids. The basic problem in NMR of solids is that rapid molecular tumbling and diffusion are not naturally present to average out chemical shift anisotropy and dipolar couplings of abundant spin nuclides. Hence, the lines are normally broad and unresolved (often hundreds of ppm in width). A large number of techniques have been developed to improve the resolution in NMR of solids, but most modern techniques include extremely rapid spinning of the sample at the "Magic Angle" (the zero of the second Legendre polynomial, 54.7.degree.) with respect to $B_0$. If the rotational rate is fast compared to chemical shift anisotropies and dipolar couplings (in units of Hz), the resolution is dramatically improved—often by two or three orders of magnitude. Even when the spinning is not fast enough to satisfy the above conditions, substantial improvements in resolution are generally obtained from the combination of MAS and multiple-pulse methods. Similar resolution problems are encountered in liquids in inhomogeneous systems, as in tissues and the mixtures of liquids and solids, because of susceptibility variations throughout the material. Here, relatively slow MAS is often effective in improving the spectral resolution of the liquid species by several orders of magnitude.

The progress in increasing sensitivity in NMR has been impressive over the past five decades—three to five orders of magnitude, depending on the application. The most significant, generally applicable contribution to increasing the signal to noise ratio, S/N or SNR, in the past decade has been the introduction of cryoprobes for homogeneous liquid samples, such as that by Marek, U.S. Pat. No. 6,677,751 B1, in which the receiver coil, critical tuning elements, and preamps are cryogenically cooled while the sample is kept at some experimentally desired temperature, usually near room temperature (RT). Using high-purity aluminum coils and single-layer capacitors near 25 K with the preamps perhaps at 80 K, the S/N may be increased on one or more channels in a multi-resonant probe by typically a factor of three to four.

Most modern NMR applications are directed at structure determinations of complex macromolecules, where it is often desirable to utilize a probe with high S/N at two or three different frequencies simultaneously and perhaps additionally be able to lock the field on the $^2H$ resonance. RF circuit efficiencies in 3 to 5 mm triple-resonance MAS probes with a single rf solenoid for signal reception at very high fields are typically in the range of 25 35% at the low-frequency (LF) and 15 40% at the mid-frequency (MF). For examples of a triple-resonance MAS circuit with a single sample solenoid, see my U.S. Pat. No. 5,424,645 or the circuit by Martin, Paulson, and Zilm in "Design of a Triple Resonance MAS probe for High Field Solid-state NMR," in Rev. Sci. Instrum., 74, 6, 3045 3061, 2003. Note that rf efficiency is defined as the percent of rf transmit power dissipated in the sample and the sample coil, as in principle other losses can be eliminated.

Significantly higher rf efficiencies on all channels in MAS have been achieved using a cross-coil for $^1H$ and a solenoid for the MF and LF, as in my U.S. Pat. No. 6,130,537 or as discussed by Doty et al in "Magnetism in NMR Probe Design Part II: HR MAS," in Concepts in Magn. Reson., Vol 10(4), 239 260, 1998. Still efficiencies are generally in the range of 30 50% for both the LF and the MF channels. Moreover, most advanced NMR MAS applications are now at 11.7 T or higher and also are requiring magic angle gradients, as disclosed by Cory in U.S. Pat. No. 5,872,452, and automatic sample change, all of which tend to push rf efficiencies toward the low ends of the above ranges.

Thus far, high-resolution (HR) NMR probes in which the sample coil and other circuit elements are at cryogenic temperatures have only been demonstrated for liquid samples in which the sample tube is aligned with the polarizing field, $B_0$. Triple-resonance MAS probes in which both the sample and the sample coil may be simultaneously cooled to essentially the same temperature, both below 120 K, have been commercially available for high field magnets with 40 mm and larger RT shim bores for at least 15 years. In a few cases, cooling of the sample and sample coil to as low as 30 K has been possible in double-resonance MAS probes, but most critical tuning elements in such have not usually been cooled.

Unfortunately, cryogenic cooling of the sample coil in an MAS probe in which the sample is not also near the cryogenic temperature of the sample coil appears impractical within the space constraints of normally available "standard bore" or "narrow bore" high-field NMR magnets, where the bore of the RT shim tube system is typically 40 mm. Such a probe also appears impractical even in "mid-bore" magnets, where this dimension is typically 45 mm or 51 mm. An HR CryoMAS probe, capable of triple-resonance MAS NMR in which the sample coils are cryogenically cooled while the sample is at RT, does appear practical in magnets with RT shim bores greater than 60 mm, and such will be the subject of another patent application by Doty.

Using the same coil for both transmit and receive has been the preferred approach in NMR spectroscopy probes, both for liquids and solids, for at least three decades. In this case, Hoult's principle of reciprocity, which at least in its popular usage states that the NMR S/N during reception is, among other things, proportional to the square root of the circuit efficiency for generating a transverse rf magnetic field within the sample during transmit, has seldom been challenged. Not surprisingly, maximizing rf circuit efficiency in multi-tuned NMR probes has been a major focus of several international firms over the past two decades.

While it is not difficult to achieve rf efficiency above 85% in single-tuned circuits, much lower efficiencies are always obtained in double- or triple-tuned circuits, especially for MAS probes, as noted above. The challenges are greater in MAS probes than in liquids probes primarily because the circuits must also be designed to handle very high power, which requires larger circuit components, and because the spinner assembly interferes with efficient lead routing, especially when automatic sample change is also desired in narrow-bore magnets.

Reciprocity, as defined above, fails to be valid when the various loss mechanisms (sample, sample coil, capacitors, shields, etc.) are at significantly different temperatures, as the transmit efficiencies are determined by the various resistances in the circuit, but the noise power during receive is proportional to both the resistance and its temperature. One example where reciprocity fails is in cryoprobes, such as that disclosed in U.S. Pat. No. 5,508,613, where the sample and perhaps some other minor loss components are much warmer than the sample coil.

In conventional liquids NMR probes, the noise is dominated by that from the sample coil, and cooling it is the primary objective in current cryoprobes for liquids, though of course attention is also paid to reducing the noise from other circuit tuning elements and the preamp. In triple-resonance MAS, on the other hand, the most significant single noise source can be a secondary tuning coil, and the total noise from the (critical) high-power tuning capacitors may be similar to that from the sample coil. This invention addresses MAS probes where cryogenic cooling of the sample coil is impractical. And in these cases, it allows the noise from the secondary tuning coil to be reduced by a factor of six (both its resistance and temperature are reduced), and that from the high-power capacitors to be reduced by a factor of three (often their resistance has little temperature dependence), assuming these reactive elements are cooled to 100 K, for example. Moreover, a circuit is disclosed that allows the noise contributions from the variable capacitors to be reduced to a few percent of the total. It turns out that the inventive circuit is also advantageous even when the cold zone is not cooled, but its advantages become substantial upon cooling.

The objective of this invention is to permit substantial improvement in S/N in triple-resonance HR MAS NMR in high field magnets without cooling the sample, especially where the RT shim bore is less than 55 mm. The low LF and MF efficiencies in such MAS probes suggest there is considerable opportunity for noise reduction, at least on the MF and LF channels, by cooling critical circuit elements other than the sample coil and thereby reducing their contribution to circuit noise power by a factor of three to six.

SUMMARY OF THE INVENTION

A novel MAS probe is disclosed for obtaining a substantial improvement in signal to noise (S/N) in triple-resonance high-resolution (HR) magic-angle-spinning (MAS) NMR of samples near room temperature (RT) in high field magnets, especially where the RT shim bore is less than 55 mm. Critical circuit components other than the sample coils, including both high-power capacitors and inductors for one or more channels are located in a small, thermally insulated, cold zone immediately below the sample spinner assembly. Cooling these components to 100 K allows their thermal noise power to be conveniently reduced by a factor of three or more. Variable capacitors for fine tuning are located in an RT tuning zone below the cold zone. The circuit is designed such that the currents, voltages, and standing wave ratio (SWR) in circuit tuning elements in the RT tuning zone are relatively low, so rf losses and noise contributions below the cold zone may be only a few percent. The MAS probe is also compatible with magic angle gradients, automatic sample change, multinuclear tuning, variable temperature operation, field locking, and optical spin rate detection.

BRIEF DESCRIPTION OF THE DRAWINGS

The invention will be described with respect to a drawing in several figures, of which.

DETAILED DESCRIPTION

Figure 1:
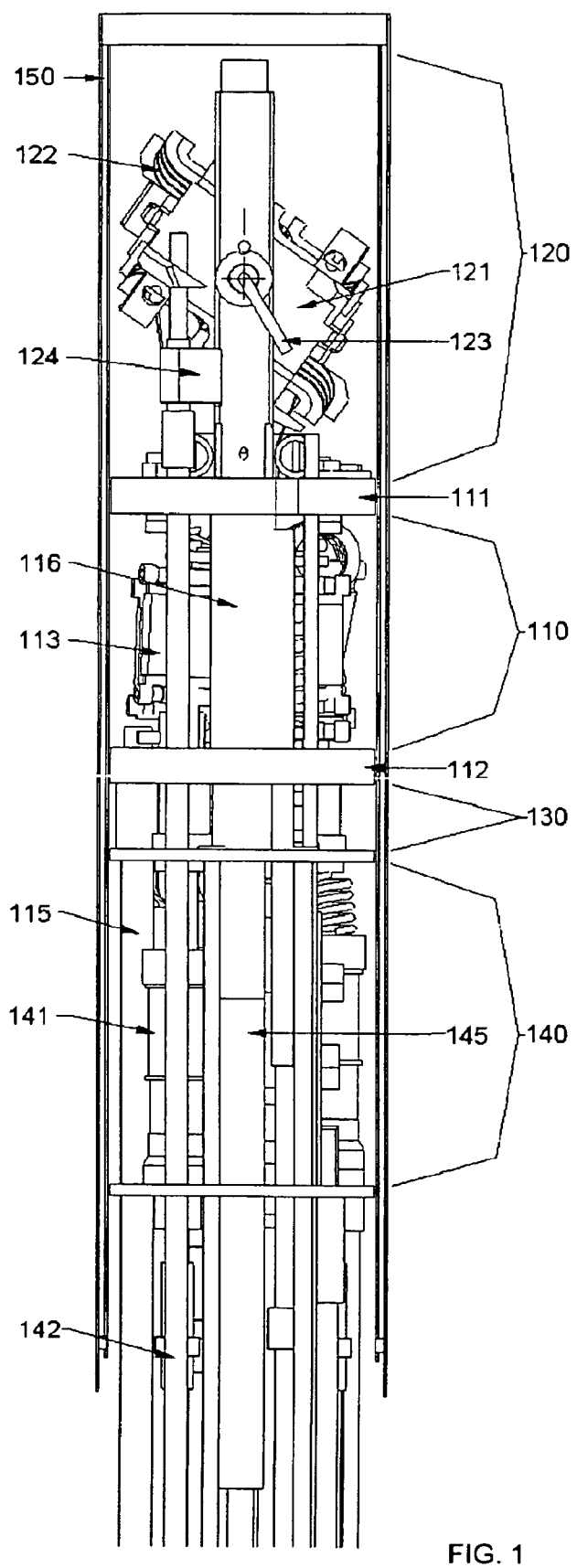
FIG. 1 is a longitudinal side view of the novel MAS probe from the Y direction.

FIG. 1 shows a side overview of the upper portion of the inventive MAS cylindrical probe structure for use in a narrow-bore or mid-bore high-field NMR magnet. Thermal barriers 111 and 112, preferably including foamed teflon, insulate the cold zone 110 from the variable-temperature spinner zone 120 and from the room-temperature first tuning zone 130, which contains variable capacitors for fine tuning of the HF channel and perhaps variable capacitors for a lock channel. A second tuning zone 140 with variable capacitors for fine tuning of the LF and MF channels is preferably positioned below the first tuning zone, though all the tuning elements could be in a single tuning zone. A low-magnetism shield dewar 150 surrounds at least the upper two zones. Note that the views of both FIG. 1 and FIG. 2 could be described as outline views on which a cross-section of the shield dewar is superimposed.

The spinner zone includes a magic angle spinner assembly 121 and also often includes a magic angle gradient coil 122, optical spin rate detection 123, and magic angle spinner orientation stop adjustment 124, all according to common industrial practice. The spinner assembly includes a rotor containing a sample, gas bearings supporting the rotor, microturbine drive, and at least one rf sample coil surrounding the rotor, all according to the extensive prior art. The sample and sample coil are both near the temperature of the bearing gas, according to the prior art, which is often allowed to be between 150 K and 450 K in "standard bore" or "narrow bore" magnets when some insulating material is present surrounding the spinner zone.

Preferably, the spinner assembly is of a drop-in type for compatibility with automatic sample change via re-orientation of the spinner from magic angle to near zero degrees with respect to $B_0$ for sample ejection and loading. It should be noted that automatic sample change in triple-resonance MAS probes with magic-angle gradients has not thus far been practical in high-field magnets with RT shim bore less than 55 mm, even though spinner assemblies theoretically compatible with automation have been available for quite some time. Examples of such spinner assemblies include Bartuska's U.S. Pat. No. 4,940,942 and Stejskal's U.S. Pat. No. 4,446,430. Another co-pending patent application by Doty discloses a novel MAS Bernoulli bearing that is beneficial in facilitating automation. A major obstacle to automation has been the loss in S/N or maximum attainable rf field strength (hence, excitation bandwidth) associated with the increased lead length required to accommodate spinner re-orientation. This problem is best addressed using an inner cross-coil for the HF and an outer solenoid for the LF and MF, as disclosed in my U.S. Pat. Nos. 6,320,384 B1 and 6,130,537.

Figure 2:
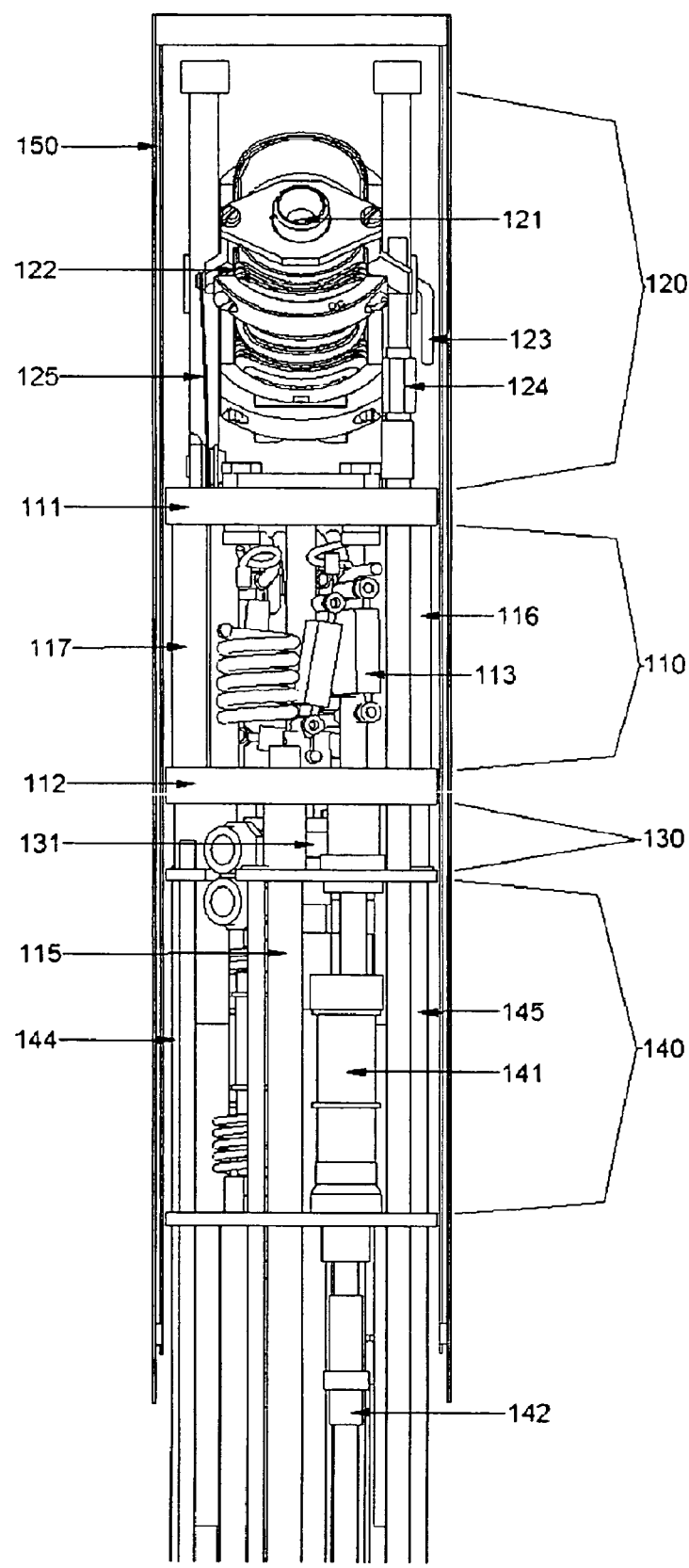
FIG. 2 is a longitudinal side view of the novel MAS probe from the X direction.

The probe assembly is rotated 90, degrees about $B_0$ in FIG. 2 to present a clearer view of some of the features and components, but the details are still intended to be representative. There, for example, one sees a string 125 for spinner axis re-orientation between alignment with magic angle and approximately $B_0$ for sample eject and loading, according to the prior art, through an insulated port (omitted for clarity in FIG. 2) through the top of the shield dewar.

Figure 3:
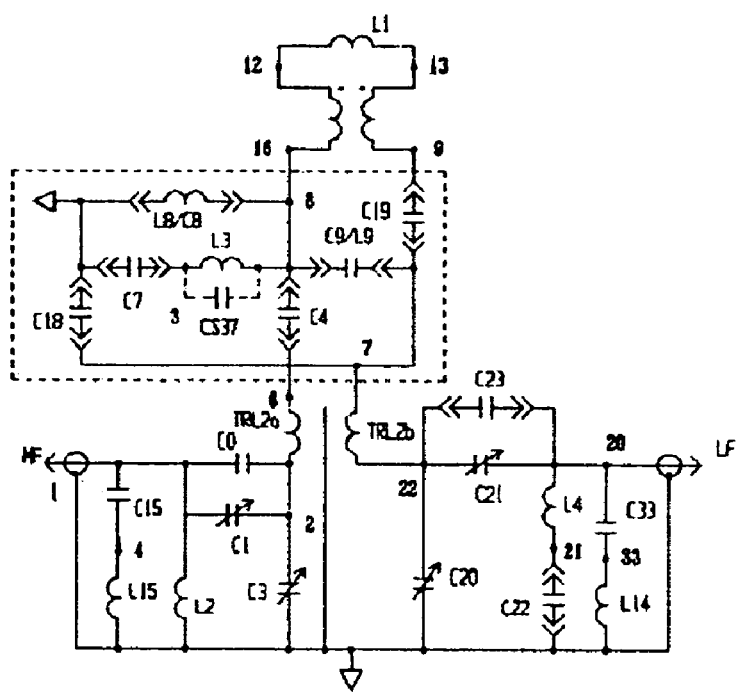
FIG. 3 is a schematic of the novel double-tuned outer-solenoid circuit.

For the preferred case of using a cross coil for the HF, FIG. 3 depicts the preferred, novel circuit for the outer LF/MF solenoid, L1. A low-loss flexible transmission line TRL1 according to the prior art, as discussed in U.S. Pat. No. 6,198, 284, connects the sample solenoid to the critical high-power tuning elements, indicated in FIG. 3 within the broken-line box, located in the cold zone 110 immediately below the spinner zone. The HF tuning variables 131 associated with the cross coil are positioned in a first tuning zone 130 between the cold zone 110 and the second tuning zone 140.

The impedance transformations in the high-power reactive elements in the cold zone insure the currents, voltages, and SWR in TRL2 in FIG. 3 are relatively low, so losses in TRL2 and the LF variables C20, C21 and MF variables C1, C3 are typically only a few percent. A minor disadvantage of the novel circuit is the reduced adjustment range of the MF and LF frequencies and the attendant requirement of increased accuracy in the circuit modeling. This circuit utilizes six plug-in reactive elements 113 plus a fixed reactive element, L3, in the cold zone and four variable capacitors 141 in the second tuning zone to permit flexibility in tuning. Adjustment rods 142 extend downward from the variable capacitors for fine tuning, possibly automatically, while the probe is in the magnet, according to the prior art. Preferably, the reactive elements 113 include at least three high power ceramic capacitors capable of handling rf voltages in excess of 2 kV. Preferably the fixed rf solenoid in the cold zone has inductance greater than 25 nH but less than 150 nH and $Q_L$ greater than 100 at RT and 100 MHz.

To support variable temperature operation, the spinner pressurized bearing gas is supplied through a bearing dewar 144 which generally includes internally a heater and sensor according to the prior art, and a second dewar 145 may be provided for variable temperature turbine drive gas, also according to the prior art. An inventive cold zone dewar 115 is required to deliver cold nitrogen gas, normally near 100 K, to the cold zone. Preferably, the conductive heat leaks from the cold zone are sufficiently small to permit adequate cooling of the cold zone with a low nitrogen gas cooling flow rate, typically about 0.3 g/s. Then, the cooling gas may simply be vented into the spinner zone where it mixes with the much higher bearing and drive gas exhaust flows and cools this zone a little. In fact, cooling of the flexible transmission leads TRL1 in the spinner zone from the sample coil into the cold zone is beneficial, so long as they are designed to be sufficiently flexible at the reduced temperature: but it is not practical to attempt to deliberately cool them, owing to the high flow rate of bearing and drive exhaust gas in the spinner zone. The minor cooling, perhaps 50 K, of the spinner zone has negligible effect on the sample temperature, which is largely determined by the bearing gas temperature; and the sample coils would typically be only slightly cooler than the bearing gas.

It is important to note that it is somewhat for convenience and emphasis that we identify zone 110 as the "cold zone", but it could perhaps more precisely be labeled as the "high-power zone", as it need not be cooled during operation. In fact, the inventive circuit disclosed in FIG. 3 normally achieves higher efficiencies and handles higher power even at RT than standard alternatives. However, the inventive circuit and probe design readily permit the critical reactive elements in this circuit to be cooled for substantial additional improvement. Upon cooling the cold zone from 300 K to 100 K, which is normally the practical limit with cooled nitrogen gas, the Q of the critical fixed inductor L3 increases by about a factor of two (at least if indium is used for the solder joints), so its noise power decreases by about a factor of six. (Note the capacitor shown in broken lines in parallel with L3 is its internal parasitic capacitance, which in important to include in a high-accuracy circuit model.) The Qs of high-power multi-layer capacitors normally increase very little upon cooling, so their noise power decreases by little more than a factor of three upon cooling to 100 K. With 100 K cooling in the cold zone, the sum of the noise from the LF/MF sample solenoid L1 at RT and the leads TRL1 then typically amounts to about 70% of the total circuit noise, so further cooling of the cold zone, as might be possible with helium gas, is of little additional benefit. Moreover, the use of helium gas would introduce serious high-voltage arcing problems.

When a cross coil is used for the HF (normally $^1H$) channel, the reduction in HF noise afforded by the cold zone is typically less than 5%, as the HF coil and capacitors will be close to the bearing gas temperature.

It is also possible, at least at fields up to about 12 T, to triple tune a single solenoid to all three frequencies, such as $^1H/^{13}C/^{15}N$, and still accommodate automatic sample change and a MAG coil. If a single sample solenoid is triple tuned to all three frequencies and all the critical circuit components external to the sample are placed in the cold zone, the HF S/N then would also benefit substantially. However, this approach still suffers from tuning difficulties and greatly increased rf sample heating compared to the preferred approach of using a cross coil for the HF and a solenoid for the LF and MF.

In some cases, only the MF and LF channels may be desired. In these cases, the cross coil and the HF tuning elements would be omitted.

The common alloy C715 (67% Cu, 30% Ni, 0.8% Fe, 0.5% Mn, 0.5% Zn), with magnetic susceptibility less than one-fourth that of austenitic stainless steel alloy SS304, has proven to have sufficiently low susceptibility for dewars 144 and 145 for most purpose, provided they terminate at least 25 mm below the center of the field. For sufficiently stable $B_0$ as temperatures in the spinner and cold zones change, at least most of the inner wall of shield dewar 150 should have an order of magnitude lower susceptibility than alloy C715 but still have very low thermal conductivity. A suitable material is alloy C876 (4.5% Si, 5.5% Zn, 0.2% Pb, 0.1% Mn, 0.1% Fe, bal. Cu) and related high-silicon bronzes. Another alloy that is sometimes adequate is C925 (11% Sn, 1.2% Ni, 1.2% Pb, 0.2% P, 0.15% Fe, bal Cu) and related high-tin bronzes. Preferably, dewar 150 inner wall alloy would have weight composition of at least 70% copper, less than 20% zinc, less than 10% nickel, less than 8% Cr, less than 4% Pb, less than 0.15% iron, less than 0.15% cobalt, and at least 3% from the set comprised of tin, silicon, aluminum, and chromium, such that RT electrical conductivity is less than 12% that of pure copper. In another embodiment the composition is selected such that the RT electrical conductivity is less than 10% that of pure copper. Note that low electrical conductivity is indicated because it generally correlates well with thermal conductivity in metals above ∼100 K and is more generally available in published data on the less common alloys. The inside surface of the inner wall of dewar 150 must then be electroplated with copper or silver, typically to a thickness of 0.02 mm, but at least 0.005 mm, for low losses in the rf currents that will be induced therein.

When alloy C715 is used for dewars 144 and 145, their top dewar seals must be near the location of thermal baffle 111, which results in substantial thermal conduction losses along their outer walls into the cold zone. This heat leak may be mitigated by insulating these dewars from the cold zone with a covering of foamed teflon 116, 117.

Preferably the magic angle gradient coil 122 will be capable of achieving 200 G/cm at duty cycles of 1% with switching times and settling times under 25 .mu.s in fields up to 20 T, according to current state of the art, which is about four times the capabilities of the MAG coils described in the patent and professional literature. Such high-performance gradients are needed for Lucio Frydman's advanced single-scan multi-dimensional techniques and for some diffusion measurements. However, the lower-performance magic angle gradients, as described in the patent and professional literature by Cory, Bronnimann, and others, would also be suitable for many purposes.

It is often desirable to be able to pulse synchronously with the sample spinning or to control the sample spinning speed precisely for other purposes. Optical spin rate detection of the rotor spinning rate may be accommodated in a manner compatible with axis re-orientation via a glass fiber light pipe 123 entering along the re-orientation axis according to the prior art.

It is often desirable to be able to stabilize or lock the $B_0$ field by pulsing the $^2H$ resonance on a fourth rf channel. A preferred method of accommodating this is to include an additional highly transparent cross coil between the $^1H$ inner cross coil and the outer solenoid, according to the prior art. This lock cross coil may be oriented orthogonally to both the $^1H$ cross coil and solenoid and still have sufficient transverse rf magnetic field when the spinner is at magic angle for the lock channel to function. With this approach, the lock fine tuning variables are preferably located in the first tuning zone 130.

Although this invention has been described herein with reference to specific embodiments, it will be recognized that changes and modifications may be made without departing from the spirit of the present invention. All such modifications and changes are intended to be included within the scope of this patent application.

What is claimed is:

1. An NMR probe containing a metallic dewar for use in a high field magnet, said dewar further characterized as having a major fraction of its inner wall made from an alloy whose weight composition includes at least 70% copper, less than 20% zinc, less than 10% nickel, less than 8% Cr, less than 4% Pb, less than 0.15% iron, less than 0.15% cobalt, and at least 3% from the set comprised of tin, silicon, aluminum, and chromium, said alloy further characterized as having electrical conductivity less than 12% that of pure copper, and said inner wall further characterized as being plated with a pure metal on at least one surface.

2. An NMR probe containing a metallic dewar for use in a high field magnet, said dewar further characterized as having a major fraction of its inner wall made from an alloy whose weight composition includes at least 70% copper, less than 20% zinc, less than 10% nickel, less than 8% Cr, less than 4% Pb, less than 0.15% iron, less than 0.15% cobalt, and at least 3% from the set comprised of tin, silicon, aluminum, and chromium, said alloy further characterized as having electrical conductivity less than boo that of pure copper, and said inner wall further characterized as being plated with a pure metal on at least one surface.

\* \* \* \* \*